(12) United States Patent
Harvey

(10) Patent No.: US 6,275,038 B1
(45) Date of Patent: Aug. 14, 2001

(54) REAL TIME MAGNETIC FIELD MAPPING USING MRI

(76) Inventor: Paul R. Harvey, 1 Hashoftim Street, Tel-Shalom, Karkoor 37074 (IL)

( * ) Notice: Subject to any disclaimer, the term of this patent is extended or adjusted under 35 U.S.C. 154(b) by 0 days.

(21) Appl. No.: 09/265,456

(22) Filed: Mar. 10, 1999

(51) Int. Cl.[7] .............................. G01V 3/00; G01R 33/20; A61B 5/055
(52) U.S. Cl. ............................................ 324/309; 324/307
(58) Field of Search .................................. 324/300–322; 600/410

(56) References Cited

U.S. PATENT DOCUMENTS

| | | | |
|---|---|---|---|
| 5,485,085 | * | 1/1996 | Sumanaweera ........................ 324/307 |
| 5,617,029 | * | 4/1997 | Schneider .............................. 324/320 |
| 5,823,959 | * | 10/1998 | Rasche .................................. 600/410 |
| 5,942,897 | * | 8/1999 | Kanazawa ............................. 324/309 |

OTHER PUBLICATIONS

Gaskill "Linear Systems, Fourier Transforms, and Optics" textbook 1978 pp. 179–184; Jan. 1978.*
"Automated Shimming at 1.5 T Using Echo–Planar Image Frequency Maps," by Timothy G. Reese et al., JMRI, vol. .5, No. 6, pp. 739–745 (1995).
"In Vivo Rapid Magnetic Field Measurement and Shimming Using Single Scan Differential Phase Mapping," by Schoichi Kanayama et al., MRM, 36, pp. 637–642 (1996).
"Robust EPI Phase Correction," by O. Heid, Institute for Diagnostic Radiology, University of Bern, Switzerland, p. 2014.
Image Reconstruction for Echo Planar Imaging With Non-equidistantk–Space Sampling, by H. Bruder et al., Magnetic Resonance in Medicine, 23, pp. 311–323 (1992).

* cited by examiner

Primary Examiner—Christine Oda
Assistant Examiner—Tiffany A. Fetzner
(74) Attorney, Agent, or Firm—Cowan, Liebowitz & Latman, P.C.; William H. Dippert

(57) ABSTRACT

A method is provided for evaluating an inhomogeneity in a magnetic polarizing field used to acquire an MRI image of a slice of a subject, at a point in the slice, the method comprising: acquiring data in a k-space for first and second k-space scans of the subject with a single application of a first MRI pulse sequence, wherein data acquisition for the second k-space scan is delayed with respect to data acquisition for the first k-space scan by a time delay; generating first and second spatial images from the first and second k-space scans; determining a phase difference between values of the first and second spatial images at the point; and evaluating the inhomogeneity at the point using the phase difference and the time delay.

20 Claims, 4 Drawing Sheets

REAL TIME MAGNETIC FIELD MAPPING USING MRI

FIELD OF THE INVENTION

The invention relates to magnetic resonance imaging (MRI) techniques and in particular to mapping magnetic fields used in MRI imaging.

BACKGROUND OF THE INVENTION

The quality and resolution of an MRI image of a subject is sensitive to inhomogeneities in a static polarizing magnetic field that is used in the imaging process to polarize nuclei in the subject. The polarizing field is ideally uniform over the volume of the subject and deviations from a desired constant value can degrade the image.

Particularly susceptible to the effects of inhomogeneities in the polarizing field are MRI images of subjects produced using gradient echo (GE) imaging, water and fat separated imaging or echo planar (EPI) imaging. Often, inhomogeneities in the polarizing field are produced as a result of magnetic susceptibility of the material or tissue of a subject imaged. Inhomogeneities resulting from magnetic susceptibility of material imaged can be especially problematic in in-vivo imaging for which strong magnetic fields are generally required.

In order to compensate for distortions in an MRI image of a subject caused by inhomogeneities in the polarizing magnetic field, the inhomogeneities are measured as a function of position. The measured inhomogeneities are used to correct the image distortions mathematically and/or to determine currents for shimming coils used to produce shimming fields to moderate the inhomogeneities.

Measurements of the magnetic field inhomogeneities are often made by acquiring two sets, hereinafter referred to as "k-space scans", of data in k-space that characterize the subject in k-space. An MRI imaging sequence is used to acquire a first k-space scan of the subject at a first time. Subsequently, following an accurately determined delay time, the imaging sequence is repeated to acquire a second k-space scan of the subject at a second time. Each of the k-space scans is used to generate a spatial image of the subject. The delay time results in phase differences between values of the two generated spatial images, which phase differences are functions of magnetic field inhomogeneities. The phase difference at a given position is proportional to the delay time and the magnitude of an inhomogeneity in the magnetic field at the position. By dividing the phase difference at the position by the time delay, the inhomogeneity in the field at the position is determined.

The acquisition of data for two images using conventional magnetic field inhomogeneity measurement procedures generally requires a time period of a few seconds or tens of seconds. In an article entitled "In Vivo Rapid Magnetic Field Measurement and Shimming Using Single Scan Differential Phase Mapping" by Kanayama et al, in MRM 36:637–642, (1996), which is incorporated herein be reference, a procedure for measuring inhomogeneities in a polarizing magnetic field from two images comprising 128×128×16 pixels each is described. In the article a data acquisition time of over a hundred seconds is reported for acquiring the two images. An article entitled "Automated Shimming at 1.5 Tesla Using Echo-Planar Image Frequency Maps", by Reese et al, in JMRI 5:739–745, (1995), which is incorporated herein by reference, also describes measuring inhomogeneities using two images of a subject. As reported in this article, each image is generated from 25 images of slices of the subject and ten seconds are required to acquire data for the two images.

In many situations long data acquisition times for magnetic field measurements compromise the usefulness of the field measurements. For example, when imaging biological processes in human organs, changes often take place in less than a second and field inhomogeneities are a function of the magnetic susceptibility of tissues in the organs. For these situations, field measurement times on the order of seconds or more are often of limited usefulness.

SUMMARY OF THE INVENTION

An aspect of preferred embodiments of the present invention is related to providing a method for rapidly acquiring data for determining inhomogeneities in a polarizing magnetic field used to provide an MRI image of a subject.

In accordance with one aspect of preferred embodiments of the present invention, two k-space scans of the subject are acquired using a single application of an MRI pulse sequence, hereinafter referred to as a "field mapping sequence", instead of using an MRI pulse sequence applied twice sequentially, as in prior art.

A field mapping sequence, in accordance with a preferred embodiment of the present invention, comprises a plurality of data acquisition cycles. In a first part of each data acquisition cycle a portion of a total amount of data required for a first k-space scan of the subject is acquired. During a subsequent second part of the data acquisition cycle a portion of a total amount of data required for a second k-space scan of the subject is acquired. The second part of each data acquisition cycle starts after the end of the first part of the acquisition cycle following an accurately determined delay time after the start of the first part of the data acquisition cycle. There are enough data acquisition cycles and the amount of data acquired for each k-space scan in each data acquisition cycle is large enough so that in a single application of the field mapping sequence the total amount of data for each of the first and second k-space scans is acquired.

As a result of the "interleaved" method of data acquisition described above, in accordance with a preferred embodiment of the present invention, both images are rapidly acquired in a single application of the field mapping sequence. Furthermore, the second k-space scan is "time displaced" with respect to the first k-space scan by an accurately known time delay, hereinafter referred to as an "acquisition delay", that is equal to the time delay between the starts of first and second parts of each of the data acquisition cycles. The acquisition delay is used, in accordance with a preferred embodiment of the present invention, to determine field inhomogeneities in the polarizing field.

When data acquisition for the two k-space scans is completed, first and second spatial images of the subject are generated respectively from the first and second k-space scans. If there are neither field inhomogeneities in the polarizing field nor errors, hereinafter referred to as "instrumental errors", in acquired k-space data caused by instrumental inaccuracies, timing inaccuracies or eddy currents, the first and second spatial images are real and identical. In the presence of field inhomogeneities and instrumental errors, values of both images have non-zero phases, which phases at same points in space are generally different for the two images. If contributions to the phases from instrumental errors are removed, a difference in phases for the two images at a point in space is substantially proportional to the product of the acquisition time delay and the magnitude of an inhomogeneity in the polarizing field at the point.

In accordance with another aspect of a preferred embodiment of the present invention, phase accumulations from instrumental errors are removed from the spatial images. The field inhomogeneity at the point is then determined, in accordance with preferred embodiments of the present invention, by dividing the phase difference by the acquisition delay.

Phase accumulations in the values of the spatial images produced by instrumental errors are evaluated, in accordance with a preferred embodiment of the present invention, from data acquired by imaging the subject with a calibration pulse sequence. Preferably, the calibration pulse sequence is incorporated in the field mapping sequence. In some preferred embodiments of the present invention the calibration pulse sequence is separate from the field mapping sequence.

There is therefore provided in accordance with a preferred embodiment of the present invention, a method for evaluating an inhomogeneity in a magnetic polarizing field used to acquire an MRI image of a slice of a subject, at a point in the slice, the method comprising: acquiring data in a k-space for first and second k-space scans of the subject with a single application of a first MRI pulse sequence, wherein data acquisition for the second k-space scan is delayed with respect to data acquisition for the first k-space scan by a time delay; generating first and second spatial images from the first and second k-space scans; determining a phase difference between values of the first and second spatial images at the point; and evaluating the inhomogeneity at the point using the phase difference and the time delay.

Preferably the MRI pulse sequence comprises a train of alternating polarity read gradient pulses having substantially same magnitude and duration, wherein the slice is perpendicular to a z axis of a spatial coordinate system and the read gradient pulses provide magnetic field gradients in the slice in an x direction of the coordinate system.

The MRI pulse sequence preferably comprises a train of substantially identical phase gradient pulses that provide a magnetic field gradient in a y direction of the coordinate system and wherein a phase gradient pulse occurs after every other read gradient pulse in the train of read gradient pulses.

Preferably, the first MRI pulse sequence comprises an RF spin refocusing pulse that defines a spin echo time for the first MRI pulse sequence, wherein the RF refocusing pulse precedes the train of read gradient pulses and a read gradient pulse of a first polarity occurs at the spin echo time.

Preferably k-space data for the first scan is acquired with read gradients of the train of read gradients having the first polarity and k-space data for the second scan is acquired with read gradients of the train of read gradients having a second polarity, the k-space data being a function of k-space coordinates $k_x$ and $k_y$ that are conjugate coordinates of x and y coordinates respectively of the spatial coordinate system.

Generating first and second spatial images preferably comprises: Fourier transforming k-space data of the first and second k-space scans so as to generate first and second Fourier-transformed k-space scans respectively that have data dependent on coordinates x and $k_y$; evaluating phase accumulation caused by instrumental error in data of the first and second Fourier-transformed scans; removing the phase accumulation from phase of data in the first and second Fourier-transformed scans to generate first and second phase-corrected Fourier-transformed scans; and Fourier transforming the first and second phase-corrected Fourier-transformed scans to generate the first and second spatial images.

Preferably, evaluating phase accumulation caused by instrumental error comprises acquiring k-space data using a second MRI pulse sequence and using the k-space data acquired with the second MRI pulse sequence to evaluate the phase accumulation.

Preferably, the second MRI sequence comprises first, second and third sequential read gradient pulses having alternating polarity and same magnitude and duration as read gradient pulses in the first MRI sequence. Preferably, the acquired k-space data is a function of substantially only $k_x$.

The second MRI pulse sequence preferably comprises an RF spin refocusing pulse that defines a spin echo time for the second MRI pulse sequence. Preferably, the second read gradient occurs at the spin echo time of the second MRI pulse sequence.

Preferably, the second read gradient has the first polarity and evaluating phase accumulation from instrumental error in data of the first Fourier-transformed scan comprises using k-space data acquired with the second read gradient.

Using k-space data acquired with the second read gradient preferably comprises: Fourier transforming data acquired with the second read gradient to generate a spatial image of the slice that is dependent upon the x coordinate; and evaluating phase accumulation from instrumental error in data of the first Fourier-transformed scan at coordinates x and $k_y$, to be equal to a phase of the spatial image at coordinate x.

Additionally or alternatively, evaluating phase accumulation from instrumental error in data of the second Fourier-transformed scan preferably comprises using k-space data acquired with the first and third read gradients.

Preferably, using k-space data acquired with the second read gradient comprises: averaging data acquired with the first read gradient with data acquired with the third read gradient to generate a set of averaged k-space data; Fourier transforming data in the set of averaged k-space data to generate a spatial image of the slice that is dependent upon the x coordinate; and evaluating phase accumulation from instrumental error in data of the second Fourier-transformed scan at coordinates x and $k_y$, to be equal to a phase of the spatial image at coordinate x.

Additionally or alternatively, the first MRI pulse sequence preferably comprises the second MRI pulse sequence.

Preferably, the second MRI pulse sequence occurs before the RF spin refocusing pulse that precedes the train of read gradient pulses in the first MRI pulse sequence. There is further provided, in accordance with a preferred embodiment of the present invention, a method for providing a substantially real time measurement of a change in a magnetic field at a point in a slice of a subject positioned in a polarizing magnetic field, the method comprising: measuring an inhomogeneity in the polarizing magnetic field at the point at a first time to acquire a first measurement of the inhomogeneity using a method in accordance with a preferred embodiment of the present invention; repeating the measurement at a second time following a short delay to acquire a second measurement of the inhomogeneity; and providing a measurement of the change by determining a difference between the first and second measurements. Preferably, the first and second measurements are performed with a shallow flip angle.

There is further provided in accordance with a preferred embodiment of the present invention, a method for providing a substantially real time measurement of a change in a magnetic field at a point in a slice of a subject positioned in a polarizing magnetic field, the method comprising: acquiring at a first time k-space data in a first region of a k-space for first and second k-space scans of the slice to determine an inhomogeneity in the polarizing magnetic field at the point using a method in accordance with a preferred embodiment of the present invention; at a second time following a short delay after said first time, acquiring k-space data for first and second k-space scans in a second region of the k-space that is included in and smaller than the first region of k-space; using the k-space data acquired at the first and second times to determine first and second k-space scans of the slice at the second time; using k-space data of the first and second k-space scans to provide a measurement of the inhomogeneity at the point at the second time, in accordance with a preferred embodiment of the present invention; and providing a measurement of the change by determining a difference between the first and second measurements.

There is further provided in accordance with a preferred embodiment of the present invention a method for providing real time measurements of changes in blood oxygenation at points in a slice of living tissue comprising: applying a polarizing magnetic field to the slice; measuring changes in the magnetic field at the points in the slice using a method according to a preferred embodiment of the present invention; and correlating the changes with changes in magnetic susceptibility of blood to determine changes in blood oxygenation at the points.

The invention will be more clearly understood by reference to the following description of preferred embodiments thereof read in conjunction with the figures attached hereto.

BRIEF DESCRIPTION OF FIGURES

In the figures, identical structures, elements or parts which appear in more than one figure are labeled with the same numeral in all the figures in which they appear. The figures are listed below and.

DETAILED DESCRIPTION OF PREFERRED EMBODIMENTS

Figure 1:
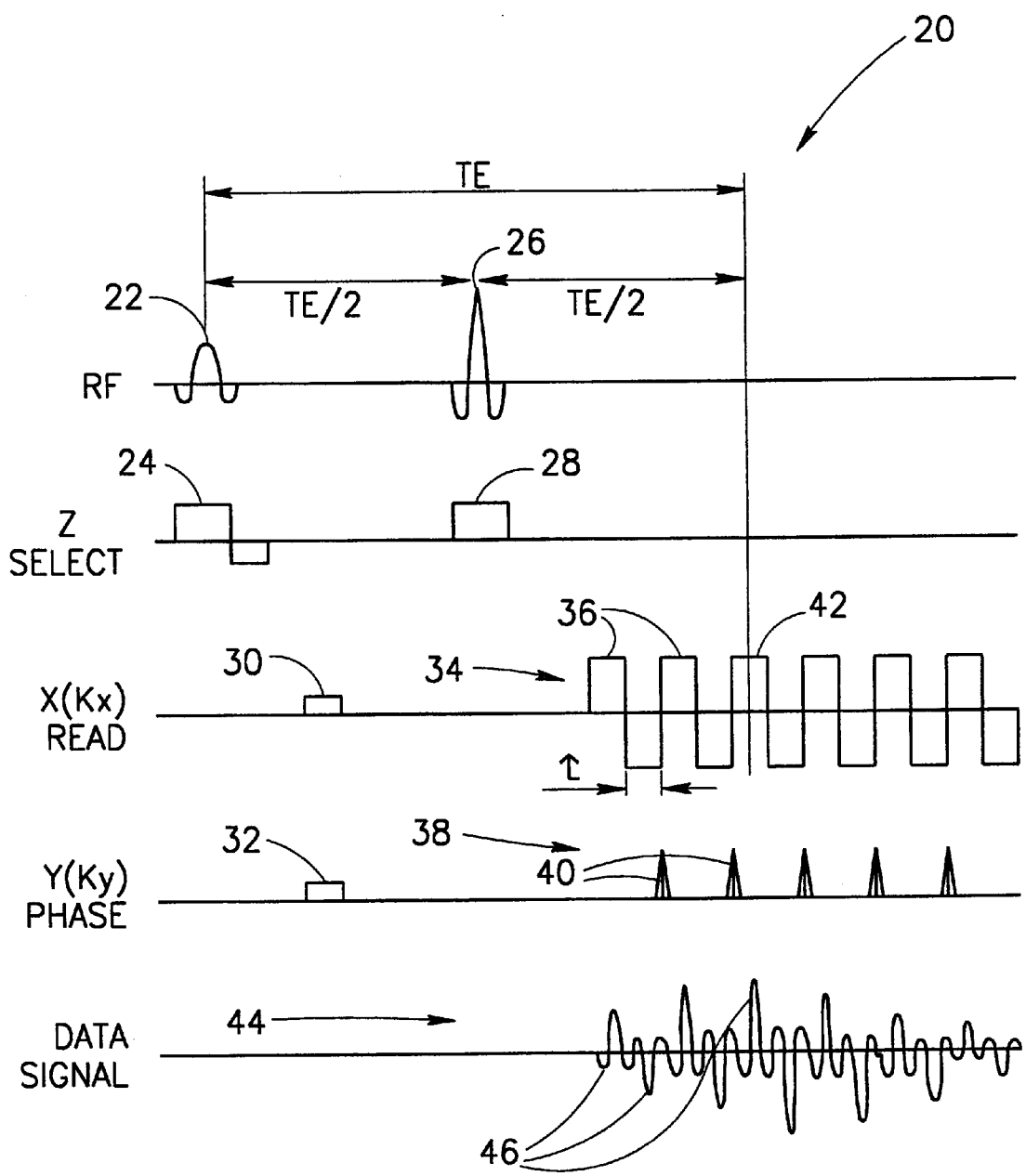
FIG. 1 schematically shows a field mapping pulse sequence for determining field inhomogeneities in a polarizing field at points in a slice of a subject, in accordance with a preferred embodiment of the present invention.

A field mapping sequence, in accordance with a preferred embodiment of the present invention, comprises a modified echo planar imaging (EPI) pulse sequence. The field mapping sequence includes a slice or volume selection RF pulse followed by a series of alternating plus and minus read gradient pulses. A phase encoding blip follows every other read gradient pulse. Preferably, the field mapping sequence comprises a 180° RF spin refocusing pulse applied at a time TE/2 seconds after the RF selection pulse, where TE is the spin echo time.

Since the phase blips occur after every other read gradient pulse instead of after every read gradient pulse, as in conventional EPI, each k-space line along the read gradient direction that is scanned for k-space data is scanned twice. Each line is first scanned with one polarity read gradient to acquire data for the first k-space scan of the subject and immediately thereafter with the subsequent read gradient of the other polarity to acquire data for the second k-space scan of the subject. Data acquisition for the second k-space scan begins later than data acquisition for the first k-space scan by an acquisition delay equal to the time that it takes to scan a line for imaging data i.e by the duration of a read gradient pulse.

First and second spatial images of the subject are generated from the first and second k-space scans respectively. Preferably, one of the k-space scans is reversed before using it to generate a spatial image. Alternatively, one of the spatial images is reversed after the spatial images are generated. Preferably, the image acquired with the negative polarity read gradients is reversed. This is required, as is well known in EPI imaging, in order for the first and second spatial images to have the same sense, i.e. "parity" with respect to the read direction. Any difference between phases of values of the first and second spatial images at a point in space resulting from field inhomogeneities is substantially equal to the product of the acquisition delay and an inhomogeneity at the point.

In accordance with a preferred embodiment of the present invention, a calibration pulse sequence that is used to measure instrumental phase errors is identical to the field measuring sequence except that no phase encoding gradients are included in the calibration sequence. Preferably, a read gradient pulse in the calibration sequence, hereinafter referred to as a "central read gradient", (and the corresponding read gradient in the field measuring sequence), is timed so that its center occurs at the spin echo time TE.

Assume that the central read gradient has the same polarity as the read gradients used to acquire data for the first k-space scan. Therefore, the read gradients, hereinafter referred to as first and second "lateral read gradients", immediately before and immediately after the central read gradient have the same polarity as the polarity of the read gradients used to acquire data for the second k-space scan.

K-space data acquired with the central read gradient is subject to the same phase accumulation from instrumental error as k-space data acquired for the first k-space scan. Furthermore, because of refocusing of nuclear spins at time TE, since the central read gradient is centered at TE there is substantially no phase accumulation from field inhomogeneity in k-space data acquired with the central read gradient. Refocusing of spins however does not affect phase accumulation caused by instrumental error. As a result, phases of a spatial image generated from data acquired with the central read gradient are caused substantially only by instrumental error. Therefore, in accordance with a preferred embodiment of the present invention, phases of a spatial image generated from data acquired with the central read gradient are used to remove phase accumulations resulting from instrumental errors from the first spatial image.

K-space data acquired with the lateral read gradients is subject to the same phase accumulation from instrumental error as k-space data acquired for the second k-space scan. However, unlike for the central read gradient, phase accumulation from field inhomogeneities in k-space data acquired with the lateral read gradients is generally not negligible. The lateral read gradients, unlike the central read gradient, are not centered on TE. On the other hand, respective phase accumulations from field inhomogeneities in k-space data acquired with the first and second lateral read gradients are substantially equal in magnitude and opposite in sign (the first and second lateral read gradients are equidistant from TE on opposite sides of TE). Phase accumulation from field inhomogeneities is anti-symmetric in time with respect to TE. Phase accumulation from instrumental error, however, is symmetric in time with respect to TE. Therefore, in a complex average of data acquired with the first and second lateral read gradients at a same point in k-space, phase accumulation from instrumental error is preserved while phase accumulation from field inhomogeneities cancels. As a result, phases of a spatial image generated from data that are complex averages of k-space data acquired with the first and second lateral read gradients arise substantially only from instrumental error.

Therefore, in accordance with a preferred embodiment of the present invention, phases of a spatial image generated from complex averages of data acquired with the first and second lateral read gradients are used to remove phase accumulations resulting from instrumental errors from the second spatial image.

FIG. 1 schematically shows a field mapping sequence 20 for determining inhomogeneities in a magnetic polarizing field used to provide an MRI image of a slice of a subject, in accordance with a preferred embodiment of the present invention. Using conventional notation, the polarizing field has a nominal constant value $B_0$ along a z direction of a convenient coordinate system The slice of the subject is perpendicular to the z-axis at a z-value equal to $Z_0$. The read axis of field mapping sequence 20 is assumed to be the x-axis and the phase encoding axis, the y-axis. Field mapping sequence 20 acquires data in k-space for first and second k-space scans of the subject at points along a trajectory in k-space comprising a plurality of equally spaced "read lines" parallel to the $k_x$ axis. Phase differences between values of first and second spatial images of the slice that are generated from the first and second k-space scans are used to determine the field inhomogeneities.

Field mapping sequence 20 comprises a 90° RF slice selection pulse 22 and an associated slice selection gradient pulse 24 in the z direction that are used to select the slice that is imaged at z coordinate $Z_0$. The midpoint of slice selection gradient pulse 24 is used as an origin of time for describing the time development of field mapping sequence 20.

At a time TE/2 a 180° RF spin refocusing pulse 26 and its associated selection gradient pulse 28 in the z direction are applied to the subject. An initializing read gradient pulse 30 in the x direction sets the value of the $k_x$ coordinate of a point, hereinafter referred to as a "scanning origin", in k-space at which field mapping sequence 20 begins acquiring data. Similarly, an initializing phase gradient pulse 32 in the y direction sets the value of the $k_y$ coordinate of the scanning origin. Initializing read and phase gradient pulses 30 and 32 respectively, are shown as positive and set the coordinates of the scanning origin to minimum values because the effect of each initializing pulse is reversed by spin refocusing RF pulse 26.

Data is acquired at points in k-space using a read gradient pulse train 34 and a phase encoding pulse train 38. Read gradient pulse train 34 comprises read gradient pulses 36 having same magnitude and duration and alternating polarity. Phase encoding pulse train 38 comprises phase encoding blips 40 having same magnitude and polarity. A phase blip 40 occurs after every other read gradient 36, at the end of every negative read gradient 36.

Read gradient pulse train 34 begins with a positive read gradient pulse 36 and phase blips 40 are positive because initializing pulses 30 and 32 are, by way of example, positive. In order for field mapping sequence 20 to acquire data at the origin of k-space, the first read gradient pulse 36 must have the same polarity as read gradient initializing pulse 30 and the polarity of encoding pulses 40 must have the same polarity as initializing phase gradient 32. A central read gradient pulse 42 of field mapping sequence 20 is a read gradient pulse 36 that is centered at the spin echo time TE of field mapping sequence 20. Central read gradient pulse 42 may be positive or negative and is shown in FIG. 1 as positive by way of example. Each read gradient pulse 36 has a pulse length "$\tau$" seconds long.

Between every pair of adjacent phase blips 40, data is acquired twice at points along a single read line in k-space parallel to the $k_x$-axis. Data for the read line is acquired first with a positive read gradient pulse 36 and then with the subsequent negative read gradient pulse 36. Data is acquired for different read lines between different pairs of adjacent phase blips 40. After each negative read gradient 36, a phase blip 40 increases $k_y$ by the same amount and advances data acquisition to the read line in k-space above and adjacent to the read line for which data is acquired before the phase blip.

The acquired k-space data are amplitudes and corresponding phases of a data signal represented by an echo pulse train 44 comprising a plurality of echo pulses 46. An echo pulse 46 occurs for and during each read gradient 36. K-space data at points along a read line are acquired by sampling the echo pulse 46 associated with the read line. Preferably, each echo pulse 46 is sampled at equal time intervals during the pulse width $\tau$ of its associated read gradient 36.

The first k-space scan of the slice at $Z_0$ comprises the data acquired with field mapping sequence 20 during positive read gradients 36. The second k-space scan of the slice comprises the data acquired with field mapping sequence 20 during negative read gradients 36. Data acquired for the second k-space scan is delayed with respect to data acquired for the first k-space scan by an acquisition delay equal to the pulse width $\tau$ of read gradients 36.

Figure 2:
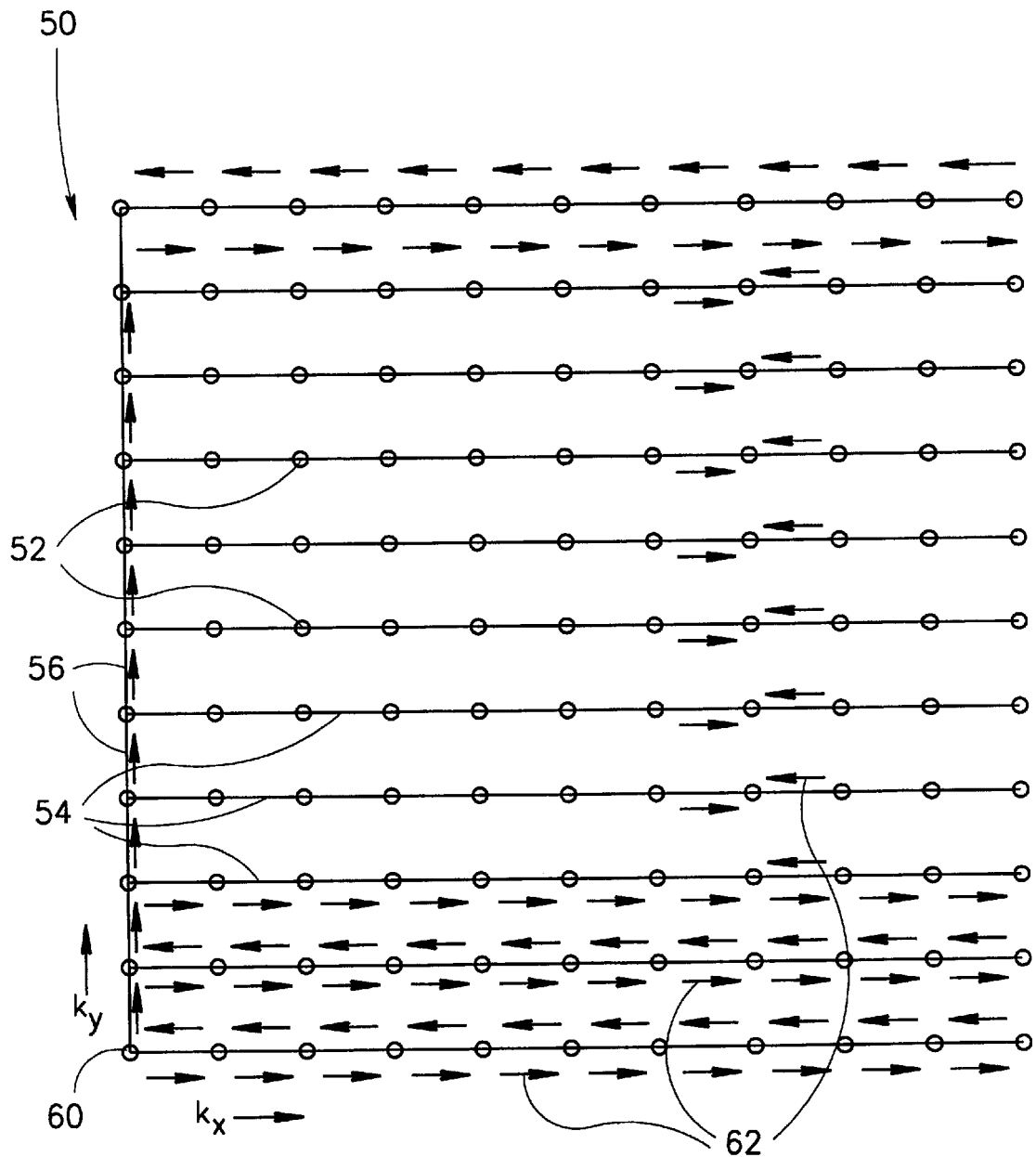
FIG. 2 schematically shows a trajectory traversed in k-space when acquiring k-space data using the field mapping sequence shown in FIG. 1.

FIG. 2 schematically shows a data scanning trajectory 50 in k-space that is traversed when acquiring k-space data for the slice imaged with field mapping sequence 20. Trajectory 50 passes through k-space points 52 at which echo pulses 46 shown in FIG. 1 are sampled to acquire the k-space data. Trajectory 50 comprises a plurality of equally spaced read lines 54 parallel to the $k_x$-axis that are connected on the left by short "phase encoding" lines 56 parallel to the $k_y$ axis. The length of read lines 54 is equal to the time integral of a read gradient pulse 36 (FIG. 1) multiplied by the gyromagnetic moment of nuclei in the slice that are used for imaging the slice. The length of phase encoding lines 56 is equal to the time integral of a phase blip 40 multiplied by the gyromagnetic moment of the imaging nuclei.

Data acquisition at points along trajectory 50 begins at a scanning origin 60 that has k-space coordinates preferably determined by initializing gradient pulses 30 and 32 shown in FIG. 1. Arrows 62 show the directions along which read lines 54 and phase encoding lines 56 are traversed. To prevent clutter, arrows 62 are not shown along all the lengths of all read lines 54.

Each read line 54 is first traversed in the direction of increasing $k_x$ during a positive read gradient pulse 36 shown in FIG. 1 and immediately thereafter in the direction of decreasing $k_x$ during the negative read gradient pulse 36 that follows the positive read gradient pulse. A traversal of a read line 54 using a positive read gradient is hereinafter referred to as a "positive scan" of the read line and a traversal using a negative gradient is hereinafter referred to as a "negative scan" of the read line.

A read line 54 is scanned for data in a period of time equal to the duration $\tau$ of read gradients 36. The negative scan of a read line therefore starts following an acquisition delay of $\tau$ seconds after the positive scan of the read line. The first k-space scan of the slice comprises data acquired during positive scans of read lines 54 and the second k-space scan of the slice comprises data acquired during the negative scans of read lines 54. Preferably, data is acquired at the same k-space points 52 on a read line 54 during the positive and negative scans of the read line.

Let k-space data for the first k-space scan that is acquired with the positive scans be represented by $S1(k_x,k_y)$ and let k-space data for the second k-space scan that is acquired with the negative scans be represented by $S2(k_x,k_y)$. Let the first spatial image of the slice that is generated by Fourier transforming $S1(k_x,k_y)$ be represented by $IM1(x,y)$. Let $IM2(x,y)$ represent the second spatial image of the slice that is generated by Fourier transforming $S2(k_x,k_y)$ after appropriate reversal of $S2(k_x,k_y)$ along the $k_x$ axis or, alternatively, by reversing the Fourier transform of $S2(k_x,k_y)$ along the x-axis. Let deviations, i.e. inhomogeneities, of the magnitude of the polarizing field from its nominal value $B_0$ at points in the slice be represented by $\Delta B(x,y,Z_0)$.

Unless phase accumulation from instrumental error in $S1(k_x,k_y)$ and $S2(k_x,k_y)$ is removed values of both $IM1(x,y)$ and $IM2(x,y)$ have phase as a result of both instrumental errors and/ field inhomogeneities. In order to measure field inhomogeneities, in accordance with a preferred embodiment of the present invention, effects of instrumental error on phases of values of $S1(k_x,k_y)$ and $S2(k_x,k_y)$ are evaluated using a calibration pulse sequence, as described in the discussion of FIG. 3 below, and removed. Phase in spatial images $IM1(x,y)$ and $IM2(x,y)$ generated from "phase corrected" $S1(k_x,k_y)$ and $S2(k_x,k_y)$ are caused substantially only by inhomogeneities in $B_0$ and it can be shown that $\gamma \cdot \Delta B(x,y,Z_0) \cdot \tau = \arg(IM2(x,y)/IM1(x,y))$, where $\gamma$ is the gyromagnetic moment of the imaging nuclei. From this relationship, in accordance with preferred embodiments of the present invention, the field inhomogeneity $\Delta B(x,y,Z_0)$ is evaluated as $\Delta B(x,y,Z_0)=[\arg(IM2(x,y)/IM1(x,y))]/(\gamma \cdot \tau)$.

Figure 3:
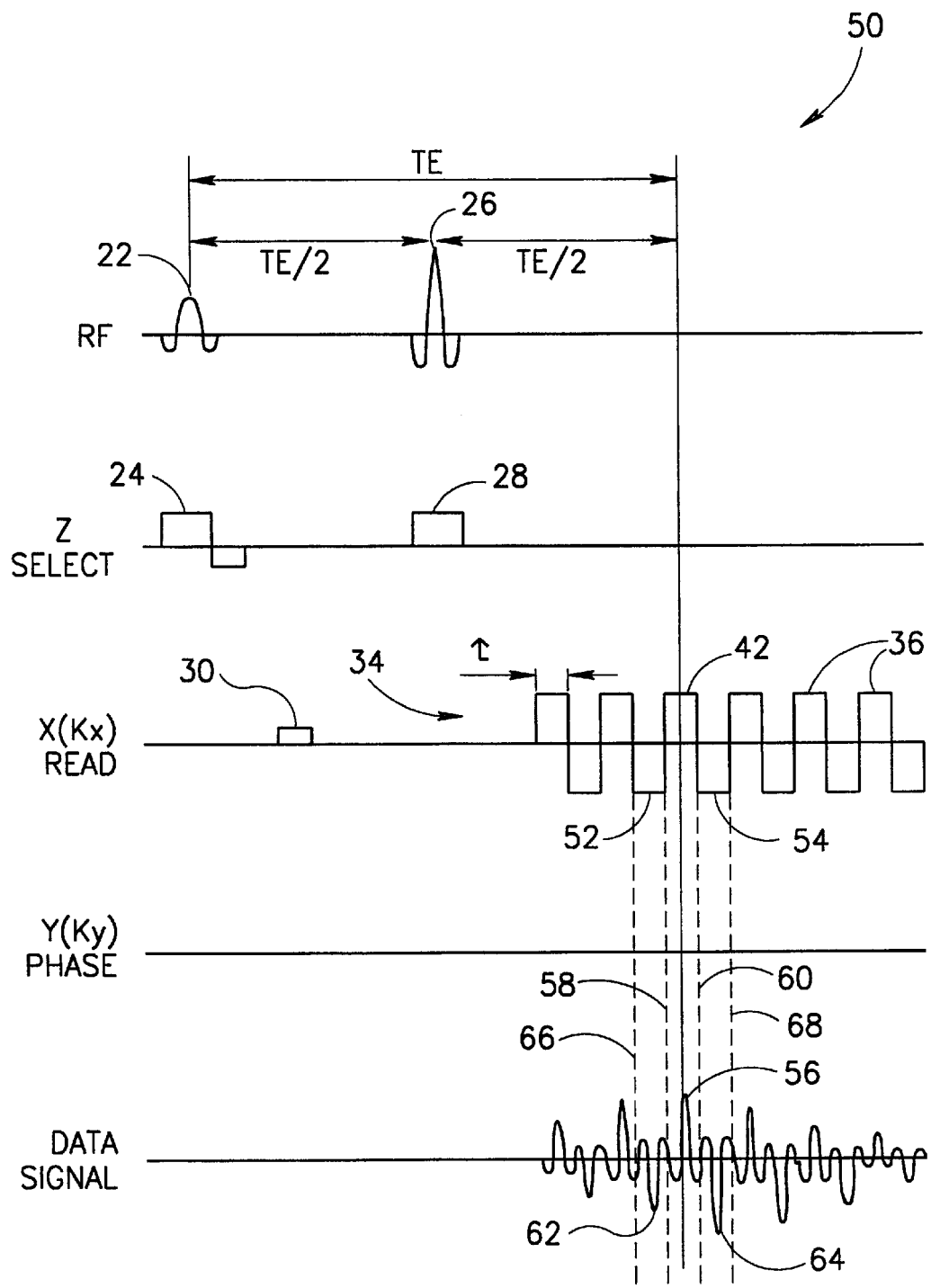
FIG. 3 schematically shows a calibration pulse sequence for the field mapping sequence shown in FIG. 1, in accordance with a preferred embodiment of the present invention.

FIG. 3 shows a calibration pulse sequence 50 used to measure the effects of instrumental error on the phases of values of k-space scans $S1(k_x,k_y)$ and $S2(k_x,k_y)$. Calibration sequence 50 is preferably identical to field measuring sequence 20 shown in FIG. 1 except that in calibration sequence 50 there is no initializing phase gradient 32 nor are there any phase blips 40. First and second lateral read gradient pulses 52 and 54 are read gradient pulses 36 in pulse train 34 that respectively immediately precede and immediately follow central read gradient pulse 42.

Instrumental phase errors are preferably evaluated for $S1(k_x,k_y)$ from k-space data acquired with central read gradient 42. K-space data acquired with central read gradient 42 is acquired by sampling the amplitude and phase of an echo pulse 56 that occurs during central read gradient pulse 42. Echo pulse 56 is shown between dotted lines 58 and 60, which lines demarcate the beginning and end of central read gradient pulse 42.

Central read gradient 42 has the same polarity (positive) as read gradients 36 of field mapping sequence 20 (FIG. 1) that are used to acquire $S1(k_x,k_y)$. As a result, instrumental phase accumulation in k-space data acquired with central read gradient 42 is substantially the same as instrumental phase accumulation in k-space data acquired with any of positive read gradients 36. Furthermore, because central read gradient pulse 42 is centered at spin echo time TE, there is substantially no phase accumulation caused by field inhomogeneity in k-space data acquired with central read gradient 42. Therefore, in accordance with a preferred embodiment of the present invention, phase accumulation in k-space data acquired with central read gradient 42 is used to remove phase accumulation from instrumental error in $S1(k_x,k_y)$. Let the data acquired with central read gradient 42 be represented by a "calibration" k-space scan function, $CS1(k_x,k_y=0)=CS1(k_x,0)$. The second argument of $CS1(k_x,0)$ is shown equal to zero because $CS1(k_x,0)$ is acquired without phase encoding, i.e. $k_y=0$. In accordance with a preferred embodiment of the present invention, $CS1(k_x,0)$ is Fourier transformed to generate a spatial image of the slice. Let this spatial image be represented by $CI1(x)$ and let the phase of $CI1(x)$ at location x be represented by $\phi(x)$. Preferably, $\phi(x)$ at any point x is estimated to first order in x from a least squares fit to phases of $CI1(x)$. $CI1(x)$ represents the average density of material in the slice at spatial coordinate x.

To correct $S1(k_x,k_y)$ for instrumental error phase accumulation, in accordance with a preferred embodiment of the present invention, $S1(k_x,k_y)$ is Fourier transformed in the $k_x$ coordinate to "convert" $k_x$ to x. Let the result of this Fourier transformation be represented by $S1'(x,k_y)$. The phase of $S1'(x,k_y)$ at coordinates $(x,k_y)$ is corrected by subtracting from the phase a phase equal to $\phi(x)$, where $\phi(x)$ is preferably estimated from the least squares fit mentioned above. Following the correction for instrumental phase error accumulation, $S1'(x,k_y)$ is Fourier transformed in the $k_y$ coordinate to generate spatial image $IM1(x,y)$.

For k-space scan $S2(k_x,k_y)$, phase accumulation from instrumental error is preferably evaluated using first lateral read gradient 52 and second lateral read gradient 54. K-space data is acquired with first and second lateral read gradients 52 and 54 by sampling echo pulses 62 and 64 respectively. Echo pulse 62 occurs during first lateral read gradient 52 and is shown between dotted lines 66 and 58, which lines demarcate first lateral read gradient 52. Echo pulse 64 occurs during second lateral read gradient 54 and is shown between dotted lines 60 and 68 that demarcate second lateral read gradient 54.

First and second lateral read gradients 52 and 54 have the same polarity (negative) as read gradients 36 of field mapping sequence 20 (FIG. 1) that are used to acquire $S2(k_x,k_y)$. Phase accumulation in k-space data acquired with either of first and second lateral read gradients 52 and 54 caused by instrumental error is therefore substantially the same as instrumental phase accumulation in k-space data acquired with any of negative read gradients 36. However, unlike for k-space data acquired with central read gradient 42, k-space data acquired with lateral read gradients 52 and 54 have, in addition to phase accumulation caused by instrumental error, phase accumulation from field inhomogeneities. As a result, k-space data acquired with only one of lateral read gradients 52 and 54 is not sufficient to isolate phase contributions to $S2(k_x,k_y)$ from instrumental error. Preferably, contributions to phase accumulations in $S2(k_x,k_y)$ from instrumental error are determined using data acquired with both lateral read gradients 52 and 54 by calculating their complex average.

Let the data acquired with first and second lateral read gradients 52 and 54 be represented respectively by k-space scan functions $FLS(k_x,0)$ and $SLS(k_x,0)$. Phase accumulations from field inhomogeneities in $FLS(k_x,0)$ have substantially the same magnitude and are opposite in sign to phase accumulations from field inhomogeneities in $SLS(k_x,0)$. On the other hand, phase accumulations from instrumental errors in $FLS(k_x,0)$ are substantially the same as phase accumulations in $SLS(k_x,0)$ from instrumental errors. Therefore, a k-space calibration image function "$CS2(k_x,0)$" defined as the complex average, $(FLS(k_x,0)+SLS(k_x,0))/2$, has substantially no phase accumulation from field inhomogeneity yet retains phase accumulation resulting from instrumental error.

Therefore, in accordance with a preferred embodiment of the present invention, phase in $CS2(k_x,0)$ is used to correct phase in $S2(k_x,k_y)$ for instrumental error phase accumulation in the same manner that phase in $CS1(k_x,0)$ is used to correct $S1(k_x,k_y)$. In correcting phase in $S2(k_x,k_y)$, $CS2(k_x,0)$ is reversed along the $k_x$-axis and Fourier transformed or, alternatively, Fourier transformed and then reversed along the x-axis, to generate a spatial image of the slice. The reversal is required since $CS2(k_x,0)$ is acquired, as is $S2(k_x,k_y)$ with negative read gradients.

Acquiring the two k-space scans $S1(k_x,k_y)$ and $S2(k_x,k_y)$ of the slice and correcting the image functions for instrumental phase error has been described as requiring two imaging pulse sequences, a field mapping pulse sequence and a calibration pulse sequence. It is possible, in accordance with some preferred embodiments of the present invention, to acquire two k-space scan functions of a slice for measuring field inhomogeneity and phase error calibration data for the images in a single imaging pulse sequence.

Figure 4:
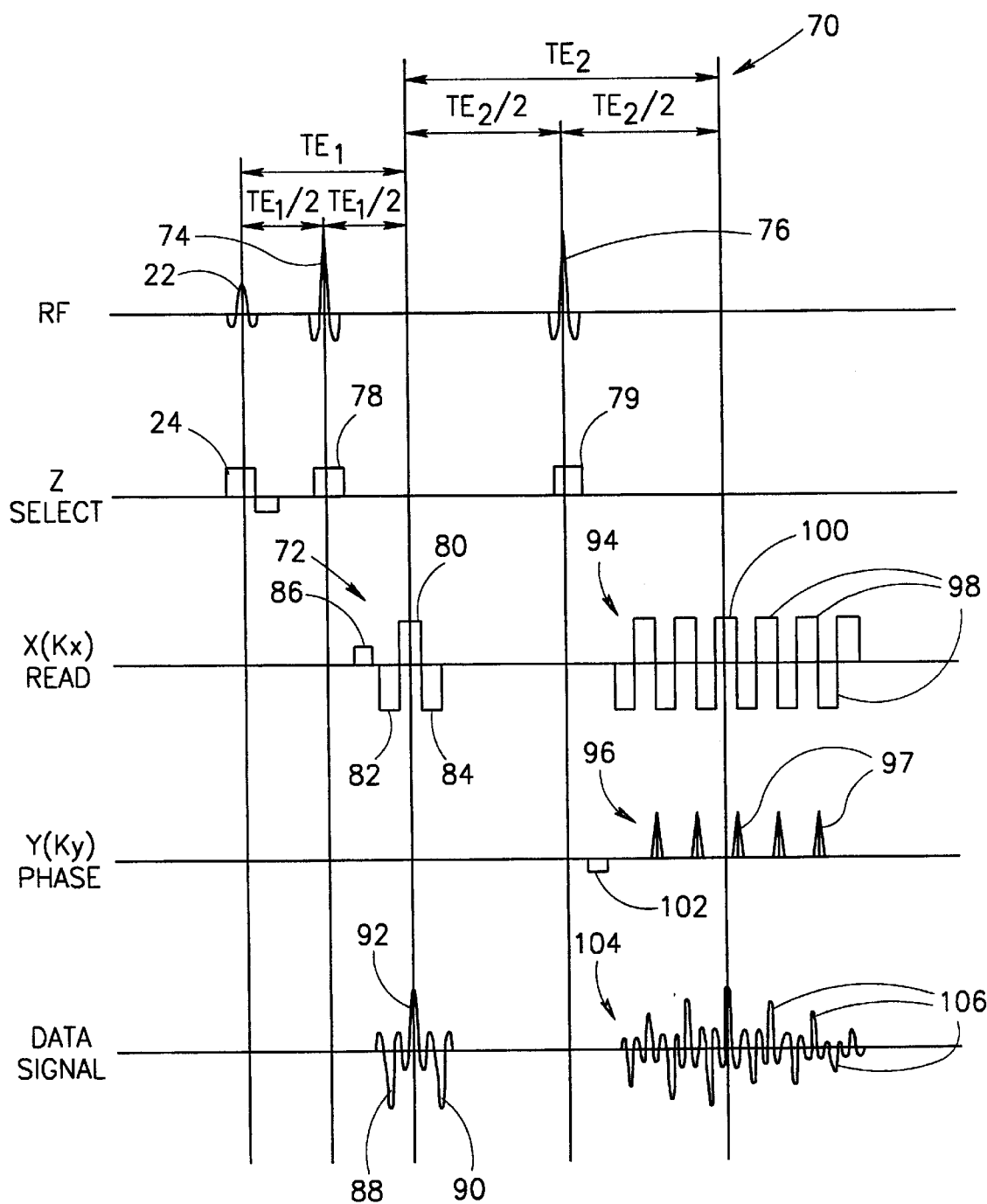
FIG. 4 schematically shows a field mapping sequence that incorporates a calibration sequence, in accordance with a preferred embodiment of the present invention.

FIG. 4 schematically shows a field mapping pulse sequence 70 that incorporates a calibration pulse sequence 72, in accordance with a preferred embodiment of the present invention.

Field mapping sequence 70 is very similar to field mapping sequence 20 shown in FIG. 1. Major differences between the two sequences are the incorporation in field mapping sequence 70 of calibration pulse sequence 72 and two 180° RF spin refocusing pulses, 74 and 76, instead of one 180° RF spin refocusing pulse 26 shown in FIG. 1.

Field mapping sequence 70 begins with an RF slice selection pulse 22 and associated slice selection gradient pulse 24. At time $TE_1/2$ 180° spin refocusing pulse 74 and an associated slice selection gradient pulse 78 are applied to the subject. Spin refocusing pulse 74 is used to refocus spins for calibration pulse sequence 72. Refocusing occurs at time $TE_1$.

Calibration pulse sequence 72 preferably comprises an initializing gradient pulse 86 and three read gradient pulses, a central read gradient pulse 80 and first and second lateral read gradient pulses 82 and 84. Calibration pulse sequence 72 preferably acquires k-space data for the slice at points that lie on the $k_x$ axis between a scanning origin of calibration pulse sequence 72 on the $k_x$ axis and a point on the $k_x$ axis that is the mirror image of the scanning origin. Initializing gradient pulse 86 sets the $k_x$ coordinate of the scanning origin to a maximum positive value. During first and second lateral read gradients 82 and 84 respectively, the $k_x$ axis is scanned between the scanning origin and its mirror image in the negative direction. K-space data for first and second lateral read gradients 82 and 84 are acquired by sampling echo pulses 88 and 90 are respectively. During central read gradient 80 the $k_x$ axis is scanned in the positive direction and k-space data is acquired by sampling an echo pulse 92. Central read gradient 80 is timed so that its midpoint coincides with $TE_1$.

At a time $TE_2/2$ following $TE_1$ a 180° spin refocusing pulse 76 and an associated slice selection gradient pulse 79 are preferably applied to the subject. Spin refocusing pulse 76 is used to refocus spins for a read gradient pulse train 94 and a phase gradient pulse train 96 that are used to acquire data for the two k-space scans of the subject. Spin refocusing occurs at a time $TE_2$ after $TE_1$.

Read gradient pulse train 94 and phase gradient pulse train 96 are similar to corresponding read and phase gradient pulse trains 34 and 38 respectively in field mapping sequence 20 shown in FIG. 1. Read gradient pulse train 94 comprises a plurality of read gradient pulses 98 having alternating polarity and same magnitude. Preferably, a positive read gradient pulse 100 of the plurality of read gradient pulses 98 has its midpoint substantially coinciding with time $TE_2$. Phase gradient pulse train 96 comprises short phase gradient blips 97 having same magnitude and polarity. A phase blip 90 follows every other read gradient pulse 98. The two k-space scans are acquired, as with field mapping sequence 20, by scanning each of a plurality of k-space read lines parallel to the $k_x$-axis twice. The $k_x$ coordinate of the scanning origin for acquiring data for the two k-space scans is the same as the $k_x$ coordinate of the scanning origin of calibration pulse sequence 72. The $k_y$ coordinate of the scanning origin for acquiring the two images is determined by an initializing pulse 102. The acquired k-space data are sampled amplitudes and corresponding phases of a data signal represented by an echo pulse train 104 comprising a plurality of echo pulses 106.

K-space data acquired with central read gradient 80 and lateral read gradients 82 and 84 of calibration pulse sequence 72 are preferably used in the same manner as k-space data acquired with central and lateral read gradients of calibration pulse sequence 50. Data acquired with central read gradient 80 are preferably used to remove instrumental phase accumulation from a spatial image generated from k-space data acquired with positive read gradients 98. Data acquired with lateral read gradients 82 and 84 are preferably used to remove instrumental phase accumulation from a spatial image generated from k-space data acquired with negative read gradients 98. Preferably, complex averages of k-space data acquired with lateral read gradients 82 and 84 are calculated and used to remove phase accumulation caused by instrumental error from the spatial image, in a similar manner as described above in the discussion of calibration pulse sequence 50.

In the case of field mapping sequence 70, data for each k-space read line is acquired first with a negative scan and then with a positive scan and a phase encoding blip 97 occurs after every positive read gradient pulse 98. It should be realized that different choices for the polarities for the gradient pulses comprised in field mapping sequence 70 (and in field mapping sequence 20) and a different order of the positive and negative scans are possible. The choices for the polarities of the gradient pulses comprised in field mapping sequences in accordance with preferred embodiments of the present invention and the order of positive and negative scans in the sequences are generally arbitrary as long as the polarities and order of positive and negative scans in a field mapping sequence are consistent with each other.

It should be noted that a field mapping sequence, in accordance with a preferred embodiment of the present invention can be used to provide real time imaging of changes in a magnetic field in a slice of a subject undergoing MRI imaging. The imaged changes can be used to track activity in the subject that generates the changes. For example, assume that a slice at a location $Z_O$ of a subject, such as an animal heart or brain, that exhibits magnetic activity (e.g. changes in magnetic susceptibility of blood in the brain as the blood is de-oxygenated) is imaged at a time t using a polarizing field $B_O$ and a field mapping sequence in accordance with a preferred embodiment of the present invention. Let the value of the magnetic field at a point $(x,y,Z_O)$ in the slice at a time t be represented by $B_S(x,y,Z_O,t)$. Differences between $B_S(x,y,Z_O,t)$ and $B_O$ that are caused by the magnetic activity in the subject will be registered and measured by the field mapping sequence as inhomogeneities $\Delta B(x,y,Z_O,t)$ in $B_O$. The time to acquire an image of the slice is on the order of a few tens of milliseconds, fast enough to acquire k-space data for a "snapshot spatial image" of $\Delta B(x,y,Z_O,t)$ and thereby of $B_S(x,y,Z_O,t)$. By repeatedly applying the field mapping sequence, preferably using a shallow flip angle that is increased with each repetition of the field mapping sequence, the snap shot image of $\Delta B(x,y,Z_O,t)$ is updated at later times to image changes in $\Delta B(x,y,Z_O,t)$ as a function of time. Changes in $\Delta B(x,y,Z_O,t)$ can be used to "image" and track the activity in the subject that generates the changes.

In some preferred embodiments of the present invention the image of $\Delta B(x,y,Z_O,t)$ is updated using techniques described in PCT application PCT/IL98/00446, entitled High Resolution Hybrid Magnetic Resonance Imager by the same inventor as the inventor of the present invention. Using these techniques, first and second k-space scans of a slice are acquired at a first time in a first region of k-space. Subsequently, at later times k-space data for first and second scans of the slice are acquired in a second region of k-space that is included in and smaller than the first region. K-space data acquired at a later time is used together with k-space data acquired at the first time to determine first and second k-space scans of the slice at the later time. The first and second k-space scans determined at the later time are processed as described above to provide measurements of $\Delta B(x,y,Z_O,t)$ at the later time.

In the claims and specification of the present application, each of the verbs, "comprise", "include" and "has", and conjugates thereof, are used to convey that the object or objects of the verb are not necessarily a complete listing of all the components, elements or parts of the subject or subjects of the verb.

The present invention has been described using non-limiting detailed descriptions of preferred embodiments thereof. Variations of the embodiments described will occur to persons of the art. For example, the detailed descriptions have described "two dimensional" field mapping sequences that are used for measuring field inhomogeneities in a slice of a subject. Three dimensional field mapping sequences for providing measurements of field inhomogeneities in a three dimensional volume region of a subject can be provided, in accordance with a preferred embodiment of the present invention, by adding phase blips in the z direction to a two dimensional field mapping sequence. Alternatively, a two dimensional field mapping pulse sequence can be repeated for different slices of the subject to provide three dimensional measurements of field inhomogeneities. The detailed descriptions are provided by way of example and are not meant to limit the scope of the invention, which is limited only by the following claims.

What is claimed is:

1. A method for measuring the inhomogeneity in a magnetic polarizing field at a point in a slice of a subject to which a magnetic polarizing field is applied to acquire an MRI image of a slice said method comprising:

(1) acquiring data in a k-space for first and second k-space scans of said subject with a single application of a first MRI pulse sequence, wherein said MRI pulse sequence, comprises:

(a) a train of alternating polarity read gradient pulses having substantially same magnitude and duration, wherein said slice is perpendicular to a z axis of a spatial coordinate system and said read gradient pulses provide magnetic field gradients in said slice in an x direction of said coordinate system;

(b) a train of substantially identical phase gradient pulses that provide a magnetic field gradient in a y direction of said coordinate system and wherein a phase gradient pulse occurs after every other read gradient pulse in said train of read gradient pulses; and (c) wherein data acquisition for said second k-space scan is delayed with respect to data acquisition for said first k-space scan by a time delay;

(2) generating first and second spatial images from said first and second k-space scans;

(3) determining a phase difference between values of said first and second spatial images at said point; and (4) measuring said the inhomogeneity at said point using said phase difference and said time delay.

2. A method for providing real time measurements of changes in blood oxygenation at points in a slice of living tissue comprising:

(1) applying a polarizing magnetic field to said slice;

(2) measuring changes in the magnetic field at said points in said slice using a method for providing a substantially real time measurement of a change in a magnetic field at a point in a slice of a subject positioned in a polarizing magnetic field, said method comprising:

(a) measuring an inhomogeneity in said polarizing magnetic field at said point at a first time to acquire a first measurement of said inhomogeneity by:

(I) acquiring data in a k-space for first and second k-space scans of said subject with a a single application of a first MRI pulse sequence, comprising:

(a) a train of alternating polarity read gradient pulses having substantially same magnitude and duration, wherein said slice is perpendicular to a z axis of a spatial coordinate system and said read gradient pulses provide magnetic field gradients in said slice in an x direction of said coordinate system;

(b) a train of substantially identical phase gradient pulses that provide a magnetic field gradient in a y direction of said coordinate system and wherein a phase gradient pulse occurs after every other read gradient pulse in said train of read gradient pulses; and (c) wherein data acquisition for said second k-space scan is delayed with respect to data acquisition for said first k-space scan by a time delay;

(II) generating first and second spatial images from said first and second k-space scans;

(III) determining a phase difference between values of said first and second spatial images at said point; and (IV) measuring said inhomogeneity at said point using said phase difference and said time delay; wherein data acquisition for said second k-space scan is delayed with respect to data acquisition for said first k-space scan by a time delay;

(B) repeating said measurement at a second time following a short delay to acquire a second measurement of said inhomogeneity; and (C) providing a measurement of said change by determining a difference between said first and second measurements; and (3) correlating said changes with changes in magnetic susceptibility of blood to determine changes in blood oxygenation at said points.

3. A method for providing real time measurements of changes in blood oxygenation at points in a slice of living tissue comprising:

(1) applying a polarizing magnetic field to said slice;

(2) measuring changes in the magnetic field at said points in said slice using a method for providing a substantially real time measurement of a change in a magnetic field at a point in a slice of a subject positioned in a polarizing magnetic field, said method comprising:

(a) acquiring at a first time k-space data in a first region of a k-space for first and second k-space scans of said slice to determine an inhomogeneity in said polarizing magnetic field at said point by:

(I) acquiring data in a k-space for first and second k-space scans of said subject with a a single application of a first MRI pulse sequence, comprising:

(a) a train of alternating polarity read gradient pulses having substantially same magnitude and duration, wherein said slice is perpendicular to a z axis of a spatial coordinate system and said read gradient pulses provide magnetic field gradients in said slice in an x direction of said coordinate system;

(b) a train of substantially identical phase gradient pulses that provide a magnetic field gradient in a y direction of said coordinate system and wherein a phase gradient pulse occurs after every other read gradient pulse in said train of read gradient pulses; and (c) wherein data acquisition for said second k-space scan is delayed with respect to data acquisition for said first k-space scan by a time delay;

(II) generating first and second spatial images from said first and second k-space scans;

(III) determining a phase difference between values of said first and second spatial images at said point; and (IV) measuring said inhomogeneity at said point using said phase difference and said time delay;

(B) at a second time following a short delay after said first time, acquiring k-space data for first and second k-space scans in a second region of said k-space that is included in and smaller than said first region of k-space;

(C) using said k-space data acquired at said first and second times to determine first and second k-space scans of said slice at said second time;

(D) using k-space data of said first and second k-space scans in accordance with claim 1 to provide a measurement of said inhomogeneity at said point at said second time;

(E) providing a measurement of said change by determining a difference between said first and second measurements; and (3) correlating said changes with changes in magnetic susceptibility of blood to determine changes in blood oxygenation at said points.

4. A method according to claim 1 wherein said first MRI pulse sequence comprises an RF spin refocusing pulse that defines a spin echo time for said first MRI pulse sequence, wherein said RF refocusing pulse precedes said train of read gradient pulses and a read gradient pulse of a first polarity occurs at said spin echo time.

5. A method according to claim 4 wherein k-space data for said first scan is acquired with read gradients of said train of read gradients having said first polarity and k-space data for said second scan is acquired with read gradients of said train of read gradients having a second polarity, said k-space data being a function of k-space coordinates $k_x$ and $k_y$ that are conjugate coordinates of x and y coordinates respectively of said spatial coordinate system.

6. A method according to claim 5 wherein generating first and second spatial images comprises:

Fourier transforming k-space data of said first and second k-space scans so as to generate first and second Fourier-transformed k-space scans respectively that have data dependent on coordinates x and $k_y$;

evaluating phase accumulation caused by instrumental error in data of said first and second Fourier-transformed scans;

removing said phase accumulation from phase of data in said first and second Fourier-transformed scans to generate first and second phase-corrected Fourier-transformed scans; and Fourier transforming said first and second phase-corrected Fourier-transformed scans to generate said first and second spatial images.

7. A method according to claim 6 wherein evaluating phase accumulation caused by instrumental error comprises acquiring k-space data using a second MRI pulse sequence and using said k-space data acquired with said second MRI pulse sequence to evaluate said phase accumulation.

8. A method according to claim 7 wherein said second MRI sequence comprises first, second and third sequential read gradient pulses having alternating polarity and same magnitude and duration as read gradient pulses in said first MRI sequence.

9. A method according to claim 8 wherein said acquired k-space data is a function of substantially only $k_x$.

10. A method according to claim 9 wherein said second MRI pulse sequence comprises an RF spin refocusing pulse that defines a spin echo time for said second MRI pulse sequence.

11. A method according to claim 10 wherein said second read gradient occurs at said spin echo time of said second MRI pulse sequence.

12. A method according to claim 11 wherein said second read gradient has said first polarity and wherein evaluating phase accumulation from instrumental error in data of said first Fourier-transformed scan comprises using k-space data acquired with said second read gradient.

13. A method according to claim 12 wherein using k-space data acquired with said second read gradient comprises:

Fourier transforming data acquired with said second read gradient to generate a spatial image of said slice that is dependent upon said x coordinate; and evaluating phase accumulation from instrumental error in data of said first Fourier-transformed scan at coordinates x and $k_y$, to be equal to a phase of said spatial image at coordinate x.

14. A method according to claim 13 wherein evaluating phase accumulation from instrumental error in data of said second Fourier-transformed scan comprises using k-space data acquired with said first and third read gradients.

15. A method according to claim 14 wherein using k-space data acquired with said second read gradient comprises:

averaging data acquired with said first read gradient with data acquired with said third read gradient to generate a set of averaged k-space data;

Fourier transforming data in said set of averaged k-space data to generate a spatial image of said slice that is dependent upon said x coordinate; and evaluating phase accumulation from instrumental error in data of said second Fourier-transformed scan at coordinates x and $k_y$, to be equal to a phase of said spatial image at coordinate x.

16. A method according to claim 15 wherein said first MRI pulse sequence comprises said second MRI pulse sequence.

17. A method according to claim 16 wherein said second MRI pulse sequence occurs before said RF spin refocusing pulse that precedes said train of read gradient pulses in said first MRI pulse sequence.

18. A method for providing a substantially real time measurement of a change in a magnetic field at a point in a slice of a subject positioned in a polarizing magnetic field, said method comprising:

(1) measuring an inhomogeneity in said polarizing magnetic field at said point at a first time to acquire a first measurement of said inhomogeneity by:

(I) acquiring data in a k-space for first and second k-space scans of said subject with a single application of a first MRI pulse sequence, comprising:

(a) a train of alternating polarity read gradient pulses having substantially same magnitude and duration, wherein said slice is perpendicular to a z axis of a spatial coordinate system and said read gradient pulses provide magnetic field gradients in said slice in an x direction of said coordinate system;

(b) a train of substantially identical phase gradient pulses that provide a magnetic field gradient in a y direction of said coordinate system and wherein a phase gradient pulse occurs after every other read gradient pulse in said train of read gradient pulses; and (c) wherein data acquisition for said second k-space scan is delayed with respect to data acquisition for said first k-space scan by a time delay;

(II) generating first and second spatial images from said first and second k-space scans;

(III) determining a phase difference between values of said first and second spatial images at said point; and (IV) measuring said inhomogeneity at said point using said phase difference and said time delay;

(2) repeating said measurement at a second time following a short delay to acquire a second measurement of said inhomogeneity; and (3) providing a measurement of said change by determining a difference between said first and second measurements.

19. A method according to claim 18 wherein said first and second measurements are performed with a shallow flip angle.

20. A method for providing a substantially real time measurement of a change in a magnetic field at a point in a slice of a subject positioned in a polarizing magnetic field, said method comprising:

(1) acquiring at a first time k-space data in a first region of a k-space for first and second k-space scans of said slice to determine an inhomogeneity in said polarizing magnetic field at said point by:

(I) acquiring data in a k-space for first and second k-space scans of said subject with a a single application of a first MRI pulse sequence, comprising:

(a) a train of alternating polarity read gradient pulses having substantially same magnitude and duration, wherein said slice is perpendicular to a z axis of a spatial coordinate system and said read gradient pulses provide magnetic field gradients in said slice in an x direction of said coordinate system;

(b) a train of substantially identical phase gradient pulses that provide a magnetic field gradient in a y direction of said coordinate system and wherein a phase gradient pulse occurs after every other read gradient pulse in said train of read gradient pulses; and (c) wherein data acquisition for said second k-space scan is delayed with respect to data acquisition for said first k-space scan by a time delay;

(II) generating first and second spatial images from said first and second k-space scans;

(III) determining a phase difference between values of said first and second spatial images at said point; and (IV) measuring said inhomogeneity at said point using said phase difference and said time delay;

(2) at a second time following a short delay after said first time, acquiring k-space data for first and second k-space scans in a second region of said k-space that is included in and smaller than said first region of k-space;

(3) using said k-space data acquired at said first and second times to determine first and second k-space scans of said slice at said second time;

(4) using k-space data of said first and second k-space scans in accordance with claim 1 to provide a measurement of said inhomogeneity at said point at said second time; and (5) providing a measurement of said change by determining a difference between said first and second measurements.

\* \* \* \* \*